United States Patent
Karsi et al.

(10) Patent No.: US 6,920,334 B1
(45) Date of Patent: Jul. 19, 2005

(54) METHOD AND APPARATUS FOR PROVIDING GAIN CONTROL FEEDBACK IN RF AMPLIFIERS

(75) Inventors: Murat F. Karsi, Encinitas, CA (US); Patrick O. Nunally, Del Mar, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/535,149

(22) Filed: Mar. 24, 2000

(51) Int. Cl.⁷ .............................. H04B 7/00; H04Q 7/20
(52) U.S. Cl. ........................ 455/522; 455/69; 455/127; 330/129; 330/282
(58) Field of Search .................... 455/522, 69, 127, 455/126; 330/129, 140, 282

(56) References Cited

U.S. PATENT DOCUMENTS

| | | | |
|---|---|---|---|
| 5,126,686 A | * 6/1992 | Tam | 330/134 |
| 5,214,393 A | 5/1993 | Aihara | |
| 5,363,071 A | * 11/1994 | Schwent et al. | 333/111 |
| 5,381,444 A | * 1/1995 | Tajima | 375/141 |
| 5,423,081 A | 6/1995 | Thiele et al. | |
| 5,623,227 A | * 4/1997 | Everline et al. | 330/2 |
| 5,710,991 A | 1/1998 | Lee | |
| 5,752,170 A | 5/1998 | Clifford | |
| 5,826,177 A | 10/1998 | Uno | |
| 5,852,770 A | 12/1998 | Kasamatsu | |
| 6,185,431 B1 | * 2/2001 | Li et al. | 455/522 |
| 6,215,987 B1 | * 4/2001 | Fujita | 455/127 |
| 6,275,105 B1 | * 8/2001 | Ghannouchi et al. | 330/151 |

FOREIGN PATENT DOCUMENTS

| | | |
|---|---|---|
| JP | 04-100426 | 4/1992 |
| JP | PUPA 06-169228 | 6/1994 |
| JP | PUPA 07-508872 | 9/1995 |
| JP | 10-079699 | 3/1998 |

OTHER PUBLICATIONS

Mini Circuits, "Directional Coupler" p. 3, Sep. 8, 1998.*

* cited by examiner

Primary Examiner—Nay Maung
Assistant Examiner—Edan Orgad
(74) Attorney, Agent, or Firm—Blakely, Sokoloff, Taylor & Zafman LLP

(57) ABSTRACT

Methods and apparatus for providing gain control feedback in rf amplifiers in such transmitting devices as cell phones. In a cell phone application, the transmit level is set by the base station. In the cell phone, the transmit level received from the base station is used to select the coupler sensing the output power of the power amplifier in the cell phone, as well as to set the power amplifier gain. This allows the selection of couplers from multiple couplers to achieve the desired coupler output sensitivity and linearity for any part of the power amplifier output power range.

4 Claims, 3 Drawing Sheets

METHOD AND APPARATUS FOR PROVIDING GAIN CONTROL FEEDBACK IN RF AMPLIFIERS

BACKGROUND OF THE INVENTION

1. Field of the Invention

The present invention relates to transmit power control in cell phones and the like.

2. Prior Art

Power amplifiers for cell phones work over a wide range of power levels when broadcasting information. The power level is dictated by the base station, and depends on numerous factors. RF couplers and sensors, or sensor/detectors, are used in the feedback loop of RF power amplifiers for gain control. The transfer characteristic of the detector typically used, Vout vs. Pout, where Vout is the output of the sensor and Pout is the output power of the power amplifier, is approximately exponential. However it is highly desirable for the sensor/detector combination to have a linear transfer characteristic over the dynamic range of the power amplifier for the most accurate control of the power amplifier. In the prior art, a single coupler element was used. However, because of the non-linear characteristics of the detector within the dynamic range of interest, compensation electronics was heretofore required to adequately linearize the detector's response.

BRIEF SUMMARY OF THE INVENTION

Methods and apparatus for providing gain control feedback in rf amplifiers in such transmitting devices as cell phones are disclosed. In a cell phone application, the transmit level is set by the base station. In the cell phone, the transmit level command received from the base station is used to select the coupler sensing the output power of the power amplifier in the cell phone, as well as to set the power amplifier gain. This allows the selection of one coupler from multiple couplers to achieve the desired coupler/detector output sensitivity and linearity for any part of the power amplifier output power range. The choice of coupler may be made using the signal from the base station setting the output power of the amplifier, so that no new information is needed for the choice. Use of the invention can avoid the requirement of costly compensatory electronics that may be required to obtain the required linearity of a single coupler/detector across the power amplifier operating range.

DETAILED DESCRIPTION OF THE PREFERRED EMBODIMENT

Figure 1:
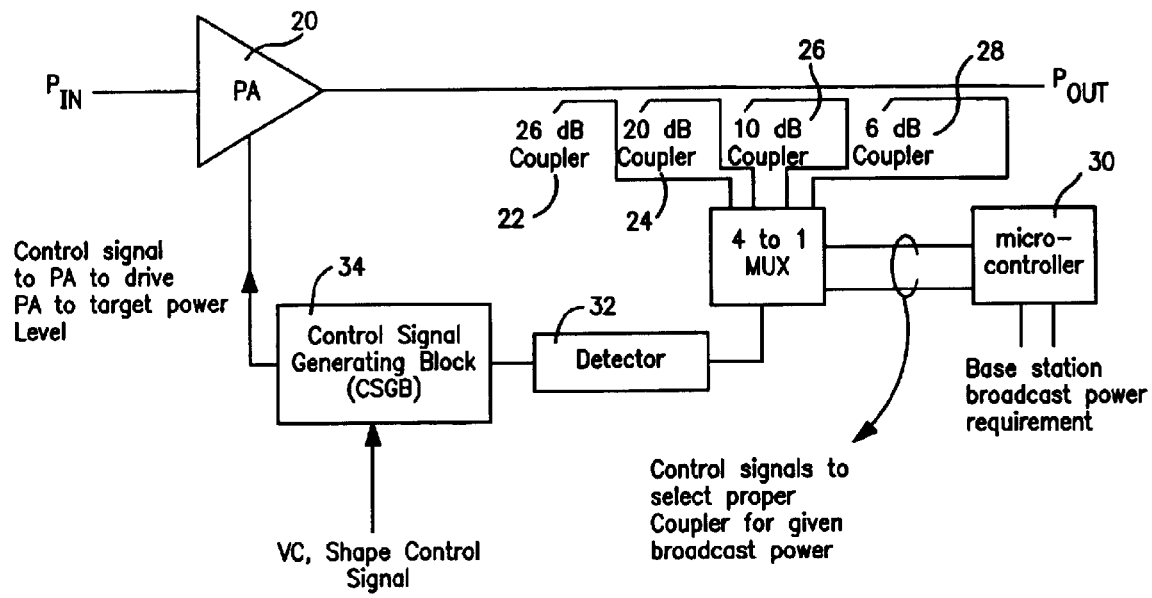
FIG. 1 is a block diagram of a preferred embodiment of the present invention.

FIG. 1 is a block diagram of an exemplary embodiment of the present invention, namely a power amplifier and burst profile control system as may be used in cell phones. As shown therein, the power amplifier 20 receives the input signal $P_{IN}$ and provides an output signal $P_{OUT}$ (the transmit signal) of appropriate power for driving the cell phone broadcast antenna. In this particular embodiment, four couplers 22, 24, 26 and 28 each provide a measure of the output power of the amplifier 20, with a multiplexer selecting one of the four coupler outputs under control of the microcontroller 30 for feedback through the detector 32 and control signal generating block 34 to control the gain of the power amplifier 20.

The four couplers 22, 24, 26 and 28 each provide a different measure of the output power of the amplifier 20, with each being designed with its own operating range of best linearity. By choosing these operating ranges of best linearity to be adjacent to each other, the desired coupler output linearity may be achieved anywhere over the full power amplifier output range without special compensation electronics by merely selecting, through the microcontroller, which of the four couplers to use for the output power commanded by the base station. In that regard, the same power selection signal from the base station used to determine the power amplifier output also determines the choice of coupler to use for that power setting.

The coupler/detector feedback loop of FIG. 1 stabilizes the performance of the power amplifier over variable conditions which cause power amplifier performance to drift. Such variables include changes in power amplifier characteristics as a function of time and/or temperature. Also, the burst profile for TDMA is controlled via the control signal generating block (CSGB) and the shape control signal VC as is well known in the art.

Figure 2:
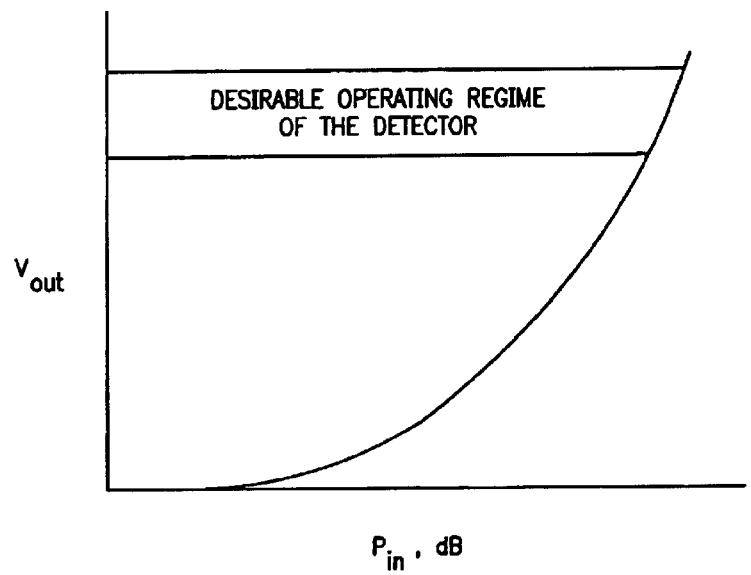
FIG. 2 is a graph illustrating a typical detector output curve.

The signal or power level to the detector is a function of the output power level of the power amplifier and the lossiness of the coupler itself. It is desirable to stay on the high gain portion of the detector output curve as shown in FIG. 2, though this is normally difficult, as the power amplifier power level changes according to the requirements set by the base station which in turn requires large changes in the power amplifier operating point. Therefore, this embodiment uses a less lossy coupler when the power amplifier is operating at low power to maintain a sufficient coupler signal to keep the input range to the detector in the high gain regime of the detector transfer function. Conversely, a more lossy coupler is used in conjunction with high power amplifier output operation to prevent saturation of the feedback electronics. In the case of FIG. 1, two address lines from the system microcontroller are used to select 1 of 4 couplers via the multiplexer to the detector, with the address bits being generated from the base station power requirement control signal.

Typically, there are a few decibels power difference between consecutive power control levels in a wireless communications standard. The detector output for these consecutive power levels should be easily distinguishable for such consecutive power control levels. The detector output is either processed with analog circuitry or digitized by an analog to digital converter (ADC) to be processed digitally. The processing is done in the Control Signal Generating Block (CSGB). Sufficient resolution is necessary between detector output levels so that the system output power level is controllable with the required precision. In the case where the processing is done using analog circuitry, the noise level on the detector output signal should be smaller than the voltage difference between consecutive levels. When the processing is done digitally, the same condition applies. However, there is also the desensitizing factor of integral nonlinearity and differential nonlinearity imperfections of the ADC. Typically, it is desirable to have at least 2–3 least significant bits between consecutive power control levels over the dynamic range of the detector.

When the present invention is used in a wireless communications system, multiple consecutive output power levels are grouped to be controlled with a single coupler. In order to verify that this set of power control levels can be controlled with the given coupling loss, the following procedure can be utilized: First, for the given set of power control levels, the smallest set of power levels at which the power amplifier output should be controlled is determined. Note that these are not necessarily the smallest power control values. There can be smaller values at which the power amplifier output should be controlled during ramp up or ramp down. For this smallest power set, if there is enough resolution between detector output values for the closest power values, then the coupling loss is appropriate for the given set of power levels. Otherwise, a smaller coupling loss should be used for the smaller power control values. For the highest power control levels, the coupling loss of the selected coupler should be such that the highest power coupled to the detector is still within the dynamic range of the detector.

Figure 3:
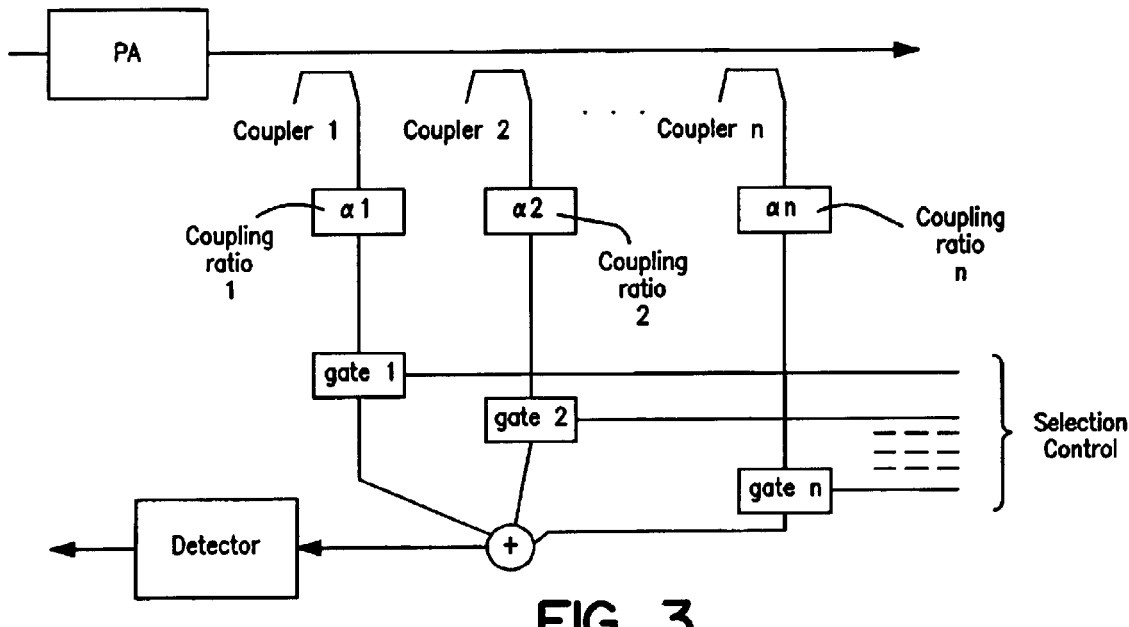
FIG. 3 is an illustration of blending of coupler outputs by combining the coupler outputs in RF before detection.
Figure 4:
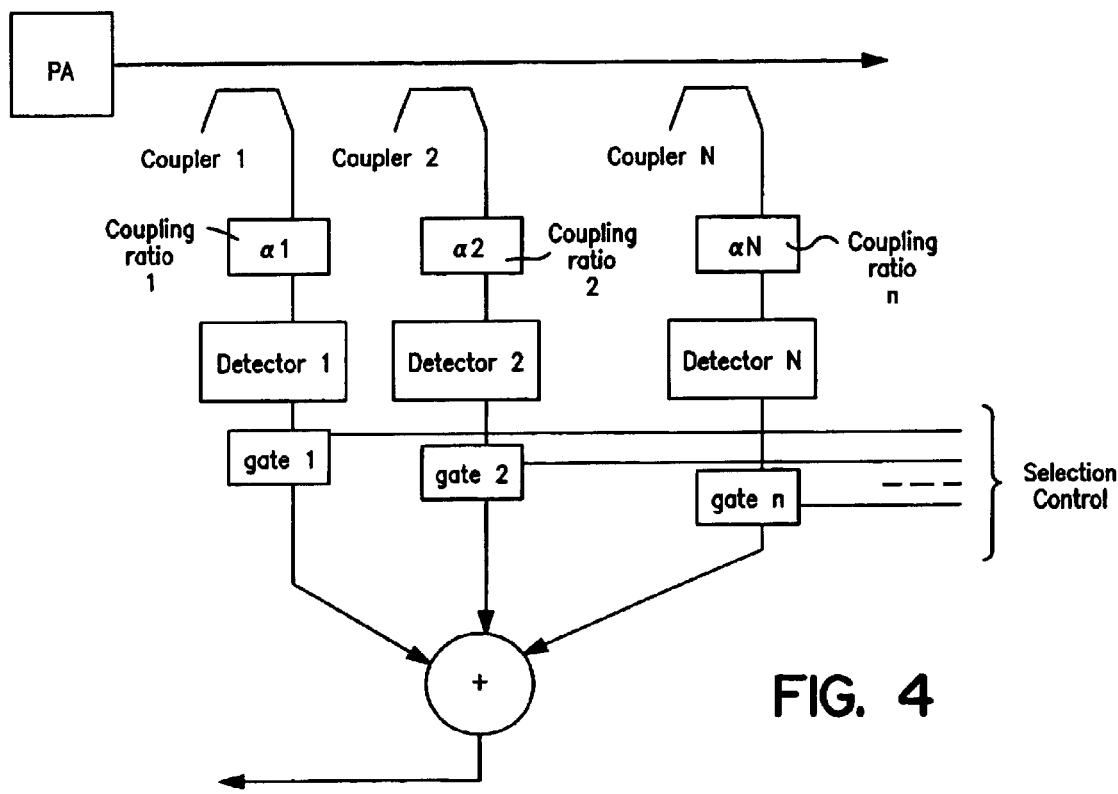
FIG. 4 is an illustration of blending of coupler outputs by combining coupler outputs after detection.

As an exemplary alternate embodiment, coupler outputs may be blended, such as by summing. This increases the total dynamic range of useful coupling ratios, and provides better resolution in terms of coupling ratios available. This also minimizes the necessary number of couplers to attain the higher dynamic range and high precision coupling. The concept is illustrated in the embodiments of FIGS. 3, and 4. The coupling losses are typically chosen such that the desired precision and dynamic range is obtained. For example, in FIGS. 3 and 4, the coupling ratios can be chosen to be $\_, \_/2, \_/4, \_/8, \_/16, \ldots, \_/2^N$. This gives a precision of $\_2^N$ and dynamic range $2\_$ for the coupling network. In these Figures, any one, all or any combination of gates may be turned on responsive to the selection control.

Figure 5:
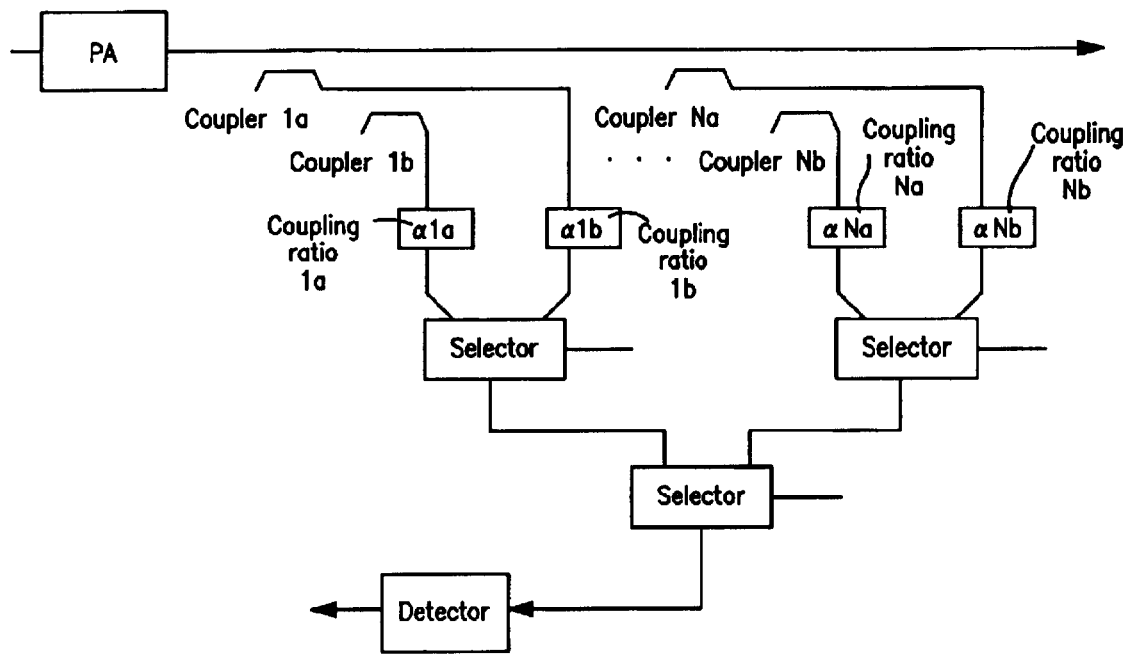
FIG. 5 is an illustration of an alternative coupling network design having successive coupling of the RF signal by cascaded couplers.
Figure 6:
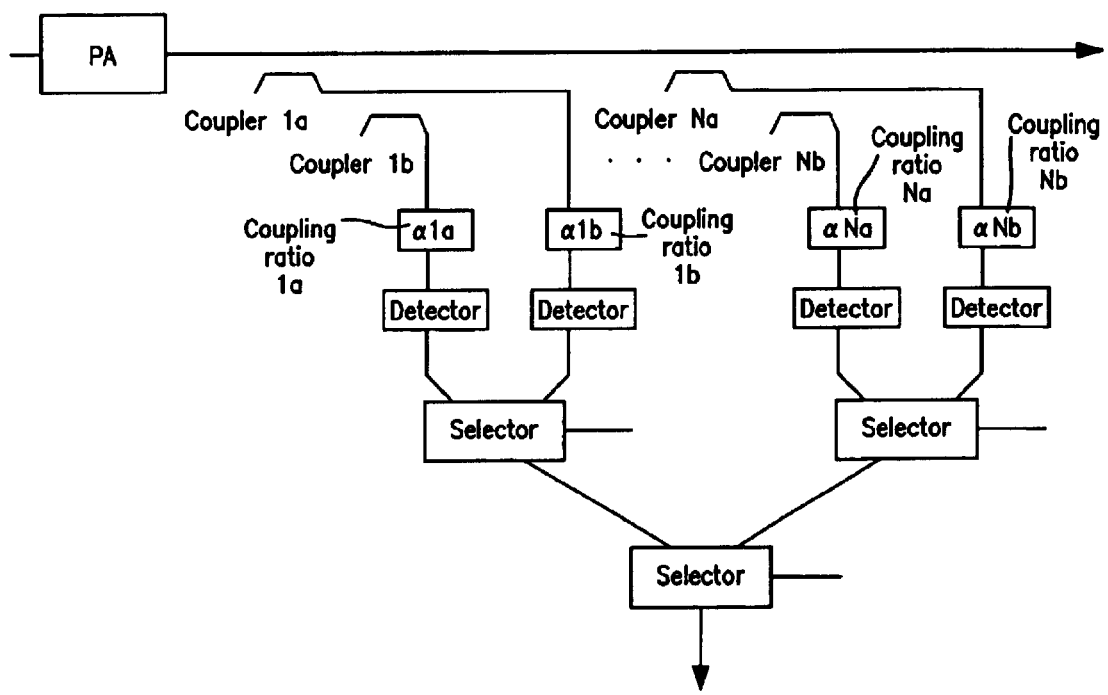
FIG. 6 is an illustration of an alternative coupling network design having successive coupling of the detector signals by cascaded detectors.

In these Figures, the outputs of the adder can be added in RF (FIG. 3), or at baseband after detection (FIG. 4). An alternative coupling network design includes the successive coupling of the RF signal by cascaded couplers as shown in FIGS. 5 and 6. This provides the benefits of high dynamic range and precision. However, the secondary couplers do not necessarily operate at high power. Detection may be done before (FIG. 5) or after (FIG. 6) detection, as in FIGS. 3 and 4, respectively. While only two couplers are shown to be cascaded in FIGS. 5 and 6, the successive coupling approach can be generalized to have any multiple number of cascaded couplers. Also the selectors may be multiplexers, or may be capable of selecting none, all or any combination of inputs provided thereto, as desired.

As previously described, the preferred embodiment uses the base station power control signals to also select the proper coupler sensor or combinations thereof for use in the feedback loop of the power amplifier. In the various embodiments disclosed, a detector output is provided as a feedback signal, the detector output being provided by the detection of a signal from a selected coupler, from selected couplers or from combinations of signals from multiple detectors. As a result, the detector feedback loop electronics are greatly simplified since they work over a smaller, more linear range of detector feedback signals.

While the present invention has been disclosed and described with respect to an exemplary embodiment thereof, it will be understood by those skilled in the art that various changes in form and detail may be made therein without departing from the spirit and scope of the invention.

What is claimed is:

1. A method of providing a gain control signal to a variable gain power amplifier comprising:

providing at least three couplers, each being responsive to output of the power amplifier and each providing a coupler output having a different coupling lossiness related by successive powers of 2;

providing a detector;

providing selectors controllable to couple the coupler outputs individually and in any combination to the detector;

receiving a commanded broadcast power setting from a base station;

controlling the selectors responsive to the commanded broadcast power setting received; and, providing, as the gain control signal, an output signal from the detector.

2. A variable gain power amplifier output system comprising:

a variable gain power amplifier;

at least three couplers, each being responsive to the output of the power amplifier and providing a coupler output having a different coupling lossiness related by successive powers of 2;

a detector;

circuitry controllable to couple the coupler outputs individually and in any combination to the detector responsive to a commanded broadcast power setting; and, the detector output being coupled to control the gain of the variable gain power amplifier.

3. A method of providing a gain control signal to a variable gain power amplifier comprising:

providing at least three couplers, each being responsive to output of the power amplifier and each providing a coupler output having a different coupling lossiness related by successive powers of 2;

providing at plurality of detectors, each coupled to a respective coupler output and providing a detector output responsive to the respective coupler output;

providing selectors controllable to couple the detector outputs individually and in any combination to a selector output;

receiving a commanded broadcast power setting from a base station;

controlling the selectors responsive to the commanded broadcast power setting received; and, providing, as the gain control signal, the selector output signal.

4. A variable gain power amplifier output system comprising:

a variable gain power amplifier;

at least three couplers, each being responsive to the output of the power amplifier and providing a coupler output having a different coupling lossiness related by successive powers of two;

a plurality of detectors, each being coupled to the output of a respective coupler and providing a detector output responsive to the respective coupler output;

selector circuitry controllable to couple the detector outputs individually and in any combination to a selector output responsive to a commanded broadcast power setting; and, the selector output being coupled to control the gain of the variable gain power amplifier.

* * * * *